United States Patent
Yu-ming Chao et al.

(10) Patent No.: US 11,860,232 B2
(45) Date of Patent: *Jan. 2, 2024

(54) PHOTODETECTION SENSOR FOR MONITORING AND FAULT DETECTION

(71) Applicant: Rivian IP Holdings, LLC, Irvine, CA (US)

(72) Inventors: Emil Yu-ming Chao, Studio City, CA (US); Charles Ed Chang, Coto de Caza, CA (US)

(73) Assignee: Rivian IP Holdings, LLC, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/859,507

(22) Filed: Jul. 7, 2022

(65) Prior Publication Data

US 2022/0334187 A1 Oct. 20, 2022

Related U.S. Application Data

(63) Continuation of application No. 16/189,982, filed on Nov. 13, 2018, now Pat. No. 11,391,777.

(51) Int. Cl.
| | |
|---|---|
| *H01M 10/48* | (2006.01) |
| *G01R 31/36* | (2020.01) |
| *G01N 21/64* | (2006.01) |
| *H01M 10/42* | (2006.01) |
| *G01R 31/12* | (2020.01) |

(52) U.S. Cl.
CPC ....... *G01R 31/3644* (2013.01); *G01N 21/645* (2013.01); *G01R 31/1218* (2013.01); *H01M 10/4285* (2013.01); *H01M 10/48* (2013.01); *H01M 10/486* (2013.01)

(58) Field of Classification Search
CPC .......................... H01M 10/4285; H01M 10/48
See application file for complete search history.

(56) References Cited

U.S. PATENT DOCUMENTS

| | | | |
|---|---|---|---|
| 5,949,219 A | 9/1999 | Weiss | |
| 8,279,074 B2 | 10/2012 | Fischer | |
| 11,391,777 B2* | 7/2022 | Yu-ming Chao | .... G01R 31/392 |
| 2009/0286148 A1 | 11/2009 | Fujikawa et al. | |
| 2011/0148359 A1 | 6/2011 | Noguchi | |
| 2013/0314094 A1 | 11/2013 | Farmer et al. | |
| 2014/0046291 A1 | 2/2014 | Harris et al. | |
| 2015/0280290 A1* | 10/2015 | Saha | .................. H01M 10/4257 324/426 |
| 2016/0013522 A1 | 1/2016 | Morrow et al. | |
| 2017/0131357 A1* | 5/2017 | Nieva | .................. G01R 31/382 |
| 2018/0321325 A1* | 11/2018 | Fortier | .................. H01M 10/48 |
| 2020/0150184 A1 | 5/2020 | Yu-Ming Chao et al. | |

* cited by examiner

*Primary Examiner* — Jeff W Natalini
(74) *Attorney, Agent, or Firm* — Haley Guiliano LLP

(57) ABSTRACT

A battery monitoring module may be arranged in such a way as to receive a sensor signal from a light sensor configured to detect light within a battery module. The battery monitoring module may determine, using processing circuitry, a light characteristic within the battery module based on the sensor signal. The battery monitoring module may determine, using processing circuitry, a battery condition of the battery module based on the light characteristic.

20 Claims, 8 Drawing Sheets

PHOTODETECTION SENSOR FOR MONITORING AND FAULT DETECTION

CROSS REFERENCE TO RELATED APPLICATIONS

This application is a continuation of U.S. patent application Ser. No. 16/189,982 (now allowed), filed Nov. 13, 2018, the disclosure of which is hereby incorporated by reference herein in its entirety.

INTRODUCTION

The present disclosure is directed to using a battery monitoring module to monitor battery conditions and characteristics.

SUMMARY

Battery modules typically include multiple battery cells coupled together in a specific configuration and encased inside a structure. In current systems, sensors that measure temperature, voltage, and current are used to monitor the operating condition of a battery module. However, these sensors often fail to determine certain battery conditions (e.g., arcing, fire, etc.) in a timely manner with only the temperature, voltage, and current data before irreversible damage is done to the battery module.

Battery modules are normally entirely contained within enclosed structures, so that no light from outside sources breaches the interior of the structure. The appearance of light inside of the enclosed structure may indicate the presence of a battery condition that emits light (e.g., arcing, a fire, or a breach to the battery enclosure). Accordingly, it would be advantageous to use a battery monitoring module equipped with at least one light-detecting sensor to monitor light within the enclosed structure. A detection of light inside the enclosure, when viewed alone or in conjunction with real-time temperature, current, and voltage data from the sensors, may indicate the presence of a battery condition that the temperature, current, and voltage data may not have detected on their own or as quickly as with the instance of the detection of light.

A battery monitoring module, according to the present disclosure, receives a sensor signal from a light sensor configured to detect light within a battery module. The battery monitoring module determines, using processing circuitry, a light characteristic within the battery module based on the sensor signal. As referred to herein, a "light characteristic" may include the intensity of the light, the wavelength of the light, or any similar properties of light, or any combination of the above. The battery monitoring module determines, using processing circuitry, a battery condition of the battery module based on the light characteristic.

In some embodiments, the battery monitoring module emits light from a light source within the battery module. The light characteristic represents a light characteristic while light is being emitted from the light source. The battery monitoring module compares the light characteristic to a reference characteristic, where the battery monitoring module determines a battery condition of the battery module by determining a smoke or particulate condition within the battery module based on the comparison.

In some embodiments, the battery monitoring module receives a battery monitoring signal from a sensor configured to detect a battery characteristic. As referred to herein, a "battery characteristic" refers to any type of battery parameter, such as, but not limited to, battery temperature, battery current, and battery voltage.

In some embodiments, the battery characteristic comprises at least one of battery temperature, battery current, and battery voltage.

In some embodiments, when the battery monitoring module is determining the battery condition of the battery module, the battery monitoring module determines the battery condition of the battery module comprises a battery fault when the light characteristic indicates an increase in light within the battery module and when the battery monitoring signal indicates a relative increase in current.

In some embodiments, the battery monitoring module determines that the battery fault comprises an arc condition when the light characteristic indicates an increase in light within the battery module and when the battery monitoring signal indicates a relative increase in current.

In some embodiments, when the battery monitoring module is determining the battery condition of the battery module, the battery monitoring module determines the battery condition of the battery module comprises a battery module breach when the light characteristic indicates light is present within the module and when the battery monitoring signal indicates that the battery module is operating within normal parameters.

In some embodiments, when the battery monitoring module is determining the battery condition of the battery module, the battery monitoring module determines a fire condition when the light characteristic indicates an increase in low frequency IR light and when the battery monitoring signal indicates an increase in temperature within the battery module.

In some embodiments, the light characteristic comprises an intensity of light corresponding to a light source. Therefore, the battery monitoring module receives at least one additional sensor signal from at least one additional light sensor configured to detect light within a battery module. In some embodiments, the light sensor and the at least one additional light sensor are each located at a different position within the battery module. The battery monitoring module determines, using the processing circuitry, at least one additional intensity of light corresponding to the light source based on the at least one additional sensor signal. The battery monitoring module determines a location of the source of light within the battery module based on the intensity of light and the at least one additional intensity of light.

In some embodiments, the one or more electrical components within the battery module emit at least one wavelength of light during normal operation, and the light sensor comprises a light filter configured to attenuate the at least one wavelength of light.

In some embodiments, the battery monitoring module identifies a temporal light intensity fluctuation in the sensor signal. The battery monitoring module differentiates light generated by one or more electrical components of the battery module and light generated by an undesirable condition based on the identified temporal light intensity fluctuation.

In some embodiments, at least one interior surface of the battery module comprises a luminescent coating configured to luminesce in response to light generated by an undesirable condition.

In some embodiments, when the battery monitoring module determines the light characteristic, the battery monitoring module determines a light characteristic for each of a plurality of wavelengths of light.

In embodiments, when the battery monitoring module determines the light characteristic, the battery monitoring module determines a light characteristic for each of a plurality of wavelengths of light, where the plurality of wavelengths of light comprises one or more of ultraviolet light, visible light, blue light, infrared light, and low frequency infrared light.

In some embodiments, when the battery monitoring module is determining the light characteristic, the battery monitoring module determines the battery condition by comparing the light characteristic for each of the plurality of wavelengths of light to reference light characteristics.

BRIEF DESCRIPTION OF THE DRAWINGS

The present disclosure, in accordance with one or more various embodiments, is described in detail with reference to the following figures. The drawings are provided for purposes of illustration only and merely depict typical or example embodiments. These drawings are provided to facilitate an understanding of the concepts disclosed herein and shall not be considered limiting of the breadth, scope, or applicability of these concepts. It should be noted that for clarity and ease of illustration these drawings are not necessarily made to scale.

DETAILED DESCRIPTION

A battery monitoring module, according to the present disclosure, including, for example, an electric-vehicle (EV) battery monitoring module, may be arranged in a way to receive a sensor signal from a light sensor configured to detect light within a battery module. Battery modules are often configured to be completely enclosed in order to protect battery cells and electronics contained within the module from environmental factors such as temperature extremes and debris. However, battery enclosures pose a challenge for monitoring the battery conditions (e.g., current, voltage, temperature, etc.) of individual battery cells, or groups of battery cells, within the battery enclosure. Conventional sensors, such as voltage, temperature, and current sensors, often fail to detect abnormal battery conditions (e.g., such as arcing, fires, damage to the battery module enclosure, etc.) in a timely manner or at all before permanent damage is done to the one or more battery cells.

A battery monitoring module, according to the present disclosure, allows the techniques of the present disclosure to be applied to a battery module in an electric vehicle. The battery monitoring module in the present disclosure determines a light characteristic within the battery module based on the sensor signal from the light sensor configured to detect light within the battery module. The detection of light within the battery module (e.g., within a sealed, battery enclosure) may indicate the presence of one or more battery cells within the battery module operating under abnormal battery conditions or damage to the battery module enclosure.

For example, in some embodiments, the battery monitoring module may receive a sensor signal from a light sensor mounted inside the battery module. The battery monitoring module may determine, using processing circuitry, that the sensor signal indicates the presence of visible light within the battery module (e.g., by determining the frequency of the light from the sensor signal). The battery monitoring module may determine, from the presence of the visible light within the battery module, that a fire broke out inside the battery module, as a fire gives off visible light wavelengths. The battery monitoring module may detect the fire faster than a conventional temperature sensor, as it may take longer for the temperature within the entire battery module to rise to a temperature that indicates an abnormal battery condition than a near-instantaneous detection of light.

Figure 1:
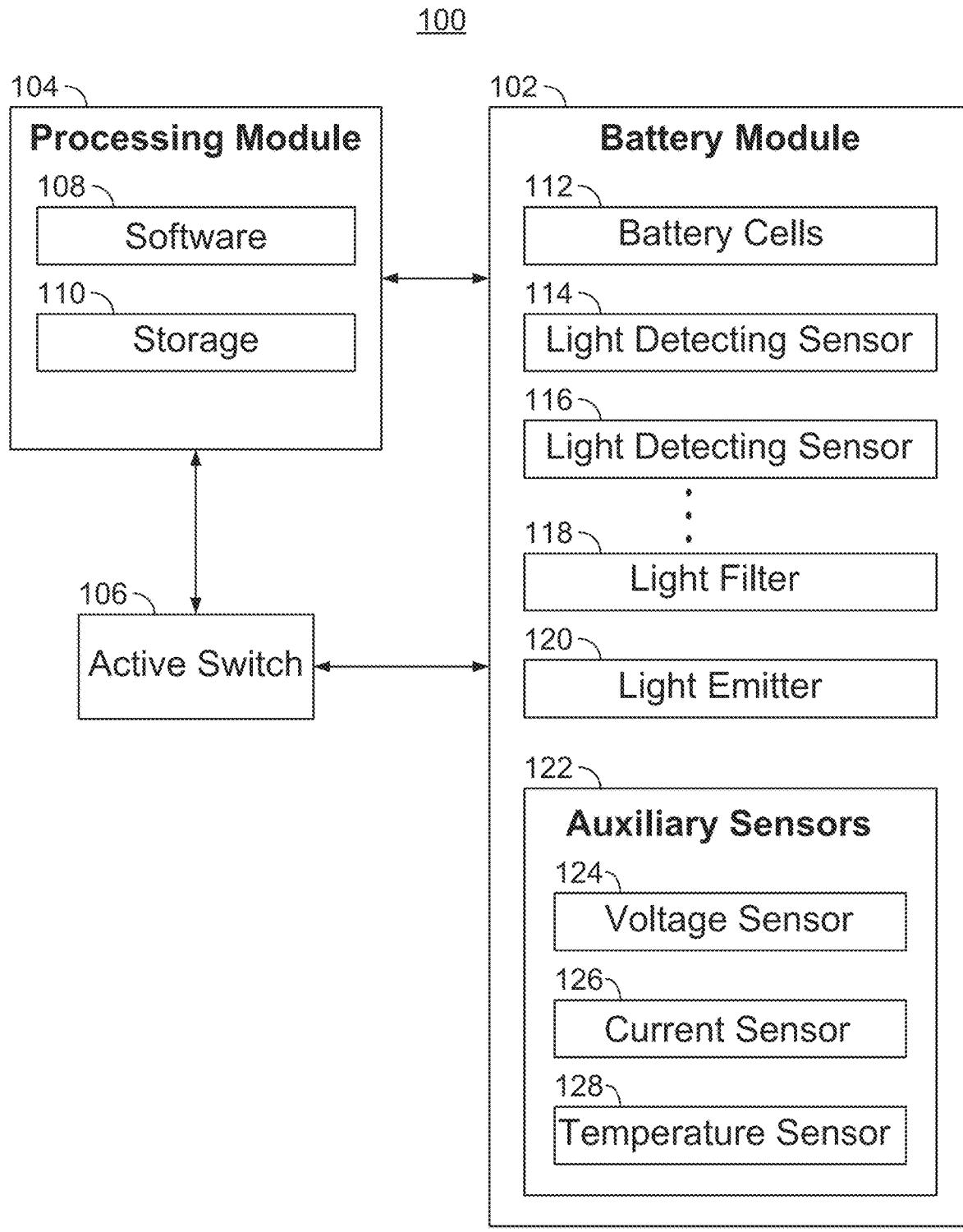
FIG. 1 shows a system diagram of an illustrative battery monitoring module, in accordance with some embodiments of the present disclosure.

FIG. 1 shows a system diagram of an illustrative battery monitoring module 100, in accordance with some embodiments of the present disclosure. Battery monitoring module 100 may comprise of battery module 102 and processing module 104. Processing module 104 includes software 108 and storage 110.

In some embodiments, processing module 104 may implement battery monitoring module 100 using software 108. Software 108 may be configured to analyze data sent from battery module 102. Software 108 may be configured to trigger warning alerts when various battery parameters fall outside of the expected operating limits of the monitored battery cells. The expected operating limits may be set by user input, or may be default limits preconfigured in software 108.

In some embodiments, processing module 104 executes instructions for a battery monitoring module stored in memory. Storage 110 may include an electronic storage device, such a memory. For example, storage 110 may be configured to store electronic data, computer software, or firmware, and may include random-access memory, read-only memory, hard drives, optical drives, solid state devices, or any other suitable fixed or removable storage devices, and/or any combination of the same. Nonvolatile memory may also be used (e.g., to launch a boot-up routine and other instructions).

In some embodiments, processing module 104 may include a processor, a power supply, power management components (e.g., relays, filters, voltage regulators), input/output IO (e.g., GPIO, analog, digital), memory, communications equipment (e.g., CANbus hardware, Modbus hardware, or a WiFi module), any other suitable components, or any combination thereof. In some embodiments, processing module 104 may include one or more microprocessors, microcontrollers, digital signal processors, programmable logic devices, field-programmable gate arrays (FPGAs), application-specific integrated circuits (ASICs), etc., and may include a multi-core processor. In some embodiments, processing module 104 may be distributed across multiple separate processors or processing units, for example, multiple of the same type of processing units or multiple different processors.

Battery module 102 includes battery cells 112, one or more light-detecting sensors, including first light-detecting sensor 114 and second light-detecting sensor 116. It will be understood that any suitable number of light detecting sensors may be used. Light detecting sensors are discussed in more detail in FIG. 5.

The one or more light-detecting sensors may be equipped with optical filter 118. Optical filter 118 may be a device that selectively transmits light of different wavelengths. For example, optical filter 118 may be an absorption filter (e.g., a filter made of various compounds added to glass or plastic, where the compounds absorb some wavelengths of light while transmitting others), a dichroic filter (e.g., a filter made by coating glass substrate with a series of optical coatings to reflect unwanted wavelengths and transmitting the remainder).

In some embodiments, optical filter 118 may not be included or may be a device that transmits all light on the wavelength spectrum. In some embodiments, optical filter 118 may be a device that transmits light only in the visible spectrum (e.g., approximately 390 nm to 700 nm). In some embodiments, optical filter 118 may be a device that transmits light only in ultraviolet spectrum (e.g., approximately 100 nm to 400 nm). In some embodiments, optical filter 118 may be a device that transmits light only in the infrared spectrum (e.g., approximately 700 nm to 1 mm). And in some embodiments, optical filter 118 may be a device that transmits light in a select few bands of the wavelength spectrum (e.g., only the infrared, visible, and ultraviolet bands of the spectrum).

In some embodiments, first light-detecting sensor 114 and second light-detecting sensor 116 may each be fitted with an optical filter such as optical filter 118 (e.g., the optical filter may be built into the light-detecting sensor, or the optical filter may be a separate piece of hardware coupled to the light-detecting sensor). Optical filter 118 may filter certain wavelengths (i.e., filter all wavelengths outside of the visible spectrum).

In some embodiments, optical filter 118 may be coupled to a light-detecting sensor to filter out light generated by one or more electrical components of battery module 102 from the light generated by an undesirable condition (e.g., a battery condition). For example, optical filter 118 may be coupled to light-detecting sensor 114 to filter out light generated by one or more electrical components (e.g., light emitting diodes (LEDs) that emit light in the ultraviolet, visible, and/or infrared wavelengths) contained within battery module 102.

Battery module 102 may also be equipped with light emitter 120. Light emitter 120 may be any device that emits light (e.g., an LED). Light emitter 120 may be controlled by processing module 104. For example, processing module 104 may transmit a signal (e.g., generate a current) to the turn on light emitter 120 (i.e., cause emitter 120 to emit light).

In some embodiments, battery module 102 may include auxiliary sensors 122. Auxiliary sensors 122 may include voltage sensor 124, current sensor 126, or temperature sensor 128, or any combination of the above. Auxiliary sensors 122 may be coupled to battery cells 112. Auxiliary sensors 122 may transmit signal data corresponding to battery data (e.g., current, voltage, and temperature data) to processing module 104. In some embodiments, multiple auxiliary sensors in tandem can be used to transmit signal data corresponding to battery data.

In some embodiments, battery module 102 may process signals from one or more of auxiliary sensors 122 or first light-detecting sensor 114 which may be, but need not be, included in battery monitoring module 100. Sensors (e.g., including light-detecting sensors and auxiliary sensors) may include sensors for sensing voltage, current, impedance, temperature, any other suitable parameter, or any combination of parameters. For example, auxiliary sensors 122 may include voltage sensor 124, which measures voltage across suitable terminals of at least one battery cell within battery cells 112. As another example, battery cells 112 may be electrically connected to busbars (e.g., subsets of batteries can be connected in parallel and different subsets can be connected in series) and voltage sensor 124 may measure voltage across suitable busbars. In a further example, auxiliary sensors 122 may include temperature sensor 128 coupled to battery cells 112 (e.g., to determine if battery cells 112 is overheating). It will be understood that multiple auxiliary sensors 122 of the same type may be used to measure the same property at different locations or across different components of battery module 102.

In some embodiments, for example, processing module 104 may differentiate light generated by electrical components and light generated by an undesirable condition. In some embodiments, for example, electrical components, which may be, but are not necessarily inside battery enclosure 102, may cause light of certain wavelengths to vary in intensity in a known way (e.g., as a function of battery load). Processing module 102 may subtract out the known wavelengths or its known signature from the overall light signal or otherwise ignore these known wavelengths. Processing module 102 may retrieve the wavelengths that vary in a known way from a database (e.g., a look up table) tabulated with editor-defined data (e.g., data provided by manufacturers of the components), user-defined data (e.g., determined from experimental results), or a combination of the above.

Processing module 104 may be coupled to the electronics (e.g., light-detecting sensors, light emitters, light filters, auxiliary sensors, etc.) within battery module 102. Processing module 104 may also include one or more switches (e.g., switch 106) coupled between processing module 104 and battery module 102. For example, switch 106 may be a SPDT relay, and light-detecting sensors 114 and 116, and auxiliary sensors 122 may include additional switched terminals for determining the position of switch 106 (e.g., using a lower voltage/power circuit).

Processing module 104 may be coupled to switch 106 and components in battery module 102 using any suitable wired, or non-wired, coupling. For example, processing module 104 may be coupled to switch 106 using suitable cables, having any suitable terminations (e.g., plugs, screw down terminals, soldered connections). In a further example, processing module 104 may communicate wirelessly (e.g., using WiFi, or Bluetooth) with switch 106, which may each include a transceiver to receive communication and actuate the corresponding switch (e.g., which may also include a power supply).

In some embodiments, light-detecting sensor 114 may detect the presence of light (e.g., the sensor is triggered). Light-detecting sensor 114 may send a signal containing information about the light (e.g., properties of the light such as wavelength, luminescence, intensity, etc.) to processing module 104. Processing module 104 may retrieve software 108 from storage 110. Software 108 may be configured to analyze the information from the signal sent from sensor 114.

In some embodiments, light-detecting sensor 114 may be activated when light (e.g., photons) is detected. Light-detecting sensor 114 may generate a current, where the amplitude of the current is proportional to the amount of light received. Processing module 104 may receive multiple signals corresponding to the current generated by light-detecting sensor 114, where the signals contain various current amplitude datum, each corresponding to a different wavelength of light or wavelength ranges of light.

In some embodiments, the detection of light from light-detecting sensor 114 may precede detection of a possible battery fault by commonly monitored parameters, such as temperature, voltage and current. The detection of light may also provide a redundant measurement and confirmation of failures detected by other sensor types. It can reduce false positives, identify actual failure more frequently, and simplify meeting safety standards for functional safety (ISO26262). For example, light-detecting sensor 114 may detect electrical arcing at low currents that may not cause a battery fuse to blow. Furthermore, electrical arcing at low currents may initially appear as anomalous current and voltage behavior that does not automatically drive immediate action. However, if there is also a simultaneous detection of the presence of light, the severity of the anomaly could be gauged, leading to the correct reactions to be implemented sooner, before a potential safety issue can worsen.

In some embodiments, software 108 may be configured to take in inputs from light-detecting sensor 114, and any other light-detecting sensors, and auxiliary sensors 122. Software 108 may analyze the one or more light signals to determine what frequencies of light are detected (e.g., ultraviolet light, visible light, blue light, infrared light, and low frequency infrared light).

In some embodiments, for example, when there is more than one light-detecting sensor (e.g., four such sensors, one on each side of battery enclosure 102), processing module 104 may determine that there is light within the battery enclosure if at least one light-detecting sensor is triggered (e.g., sends a signal to processing module 104 indicating that light was detected).

In some embodiments, for example, when there is more than one light-detecting sensor (e.g., four such sensors, one on each side of battery enclosure 102), processing module 104 may determine that there is light within the battery enclosure if at least half of the total amount of light detecting sensors are triggered (e.g., send signals to processing module 104 indicating that light was detected).

In some embodiments, for example, when there is more than one light-detecting sensor (e.g., four such sensors, one on each side of battery enclosure 102), processing module 104 may determine that there is light within the battery enclosure if at least a threshold number of light-detecting sensors are triggered (e.g., send signals to processing module 104 indicating that light was detected). The threshold number of light-detecting sensors may be retrieved from storage 110, or via a network on a remote server. The threshold number of light-detecting sensors may be editor-defined, or determined based on user input.

In some embodiments, software 108 may also take in inputs from auxiliary sensors 122. Software 108 may retrieve normal operating condition boundaries (e.g., temperature boundaries, voltage boundaries, current boundaries, etc.) from storage 110, or via a network on a remote server. Normal operation condition boundaries may be determined by test data, input by a user, default values defined by an editor, or any combination of the above. Software 108 may compare the data inputs (e.g., battery monitoring signals) from auxiliary sensors 122 (e.g., voltage sensor 124, current sensor 126, temperature sensor 128, etc.) to the normal operating condition boundaries to determine if one or more of auxiliary sensors 122 indicate that battery cells 112 are operating under abnormal conditions.

In some embodiments, software 108 may determine that the input from the battery monitoring signal from current sensor 126 indicates that the current in battery cells 112 is higher than the upper bound of the normal current operating conditions, and may determine that the input from light-detecting sensor 114 indicates the presence of light within the battery enclosure. In response to determining the indication of the presence of light in the battery enclosure, and the higher than normal current, software 108 may generate a warning alert to the user about the occurrence of a possible battery fault. As referred to herein, a battery fault is any condition that contributes to a battery operating outside of its normal operating conditions, including a breach of the battery cell packaging, one or more battery cells experiencing arcing, a short circuit, a fire, sparking, etc.

In some embodiments, software 108 may automatically power off the battery cells (e.g., using active switch 106 as a kill switch) in response to determining the occurrence of a possible battery fault.

In some embodiments, software 108 may automatically power off the entire battery module 102 using active switch 106 in response to determining the occurrence of a possible battery fault. In some embodiments, software 108 may automatically power off one or more battery cells 112 in battery module 102 using active switch 106 in response to determining the occurrence of a possible battery fault.

In some embodiments, for example, software 108 may determine that the input from the battery monitoring signal from current sensor 126 indicates that the current in battery cells 112 is higher than the upper bound of the normal current operating conditions, and may determine that the input from light-detecting sensor 114 indicates that a light wavelength in the ultraviolet range was detected. Software 108 may determine (e.g., via a lookup table of possible fault conditions using the inputs high current and UV light) that the fault condition is arcing.

In some embodiments, for example, software 108 may determine that the light signal or signals from light-detecting sensor 114 indicates that white, blue, and ultraviolet light was detected. Software 108 may determine (e.g., via a lookup table) that the fault condition is sparking in battery module 102.

In some embodiments, for example, software 108 may determine that the input from the battery monitoring signal from temperature sensor 128 indicates that the temperature in battery cells 112 is elevated (e.g., higher than normal, but may still be within normal operating range), and may determine that the input from light-detecting sensor 114 indicates that a light wavelength in the ultraviolet range was detected. Software 108 may determine (e.g., via a lookup table of possible fault conditions using the inputs elevated temperature and UV light) that the fault condition is arcing.

In some embodiments, for example, software 108 may determine that the input from the battery monitoring signal from current sensor 126 indicates that the current in battery cells 112 is higher than the upper bound of the normal current operating conditions, and may determine that the input from light-detecting sensor 114 indicates that light wavelengths in both the visible range and the ultraviolet range were detected. Software 108 may determine (e.g., via a lookup table of possible fault conditions using the inputs high current and UV and IR light waves) that the fault condition is arcing.

In some embodiments, for example, software 108 may determine that the input from the battery monitoring signal from temperature sensor 128 indicates that the temperature in battery cells 112 is elevated, and may determine that the input from light-detecting sensor 114 indicates that a light wavelength in the visible range was detected. Software 108 may determine (e.g., via a lookup table of possible fault conditions using the elevated temperature and visible light) that the fault condition is a fire and that the components in battery module 102 are heating up.

In some embodiments, for example, software 108 may determine that the input from the battery monitoring signal from temperature sensor 128 indicates that the temperature in battery cells 112 is elevated, and may determine that the input from light-detecting sensor 114 indicates that a light wavelength in the low frequency IR range was detected. Software 108 may determine (e.g., via a lookup table of possible fault conditions using the elevated temperature and low frequency IR light) that the fault condition is a fire.

In some embodiments, for example, software 108 may determine that the inputs from auxiliary sensors 122 indicates that battery cells 112 are within normal operating ranges. Software 108 may determine that the input from light-detecting sensor 114 indicates that light was detected in the battery enclosure. Software 108 may determine (e.g., via a lookup table of possible fault conditions using the normal operating conditions and detection of light) that the fault condition is a breach of the battery enclosure.

Figure 2:
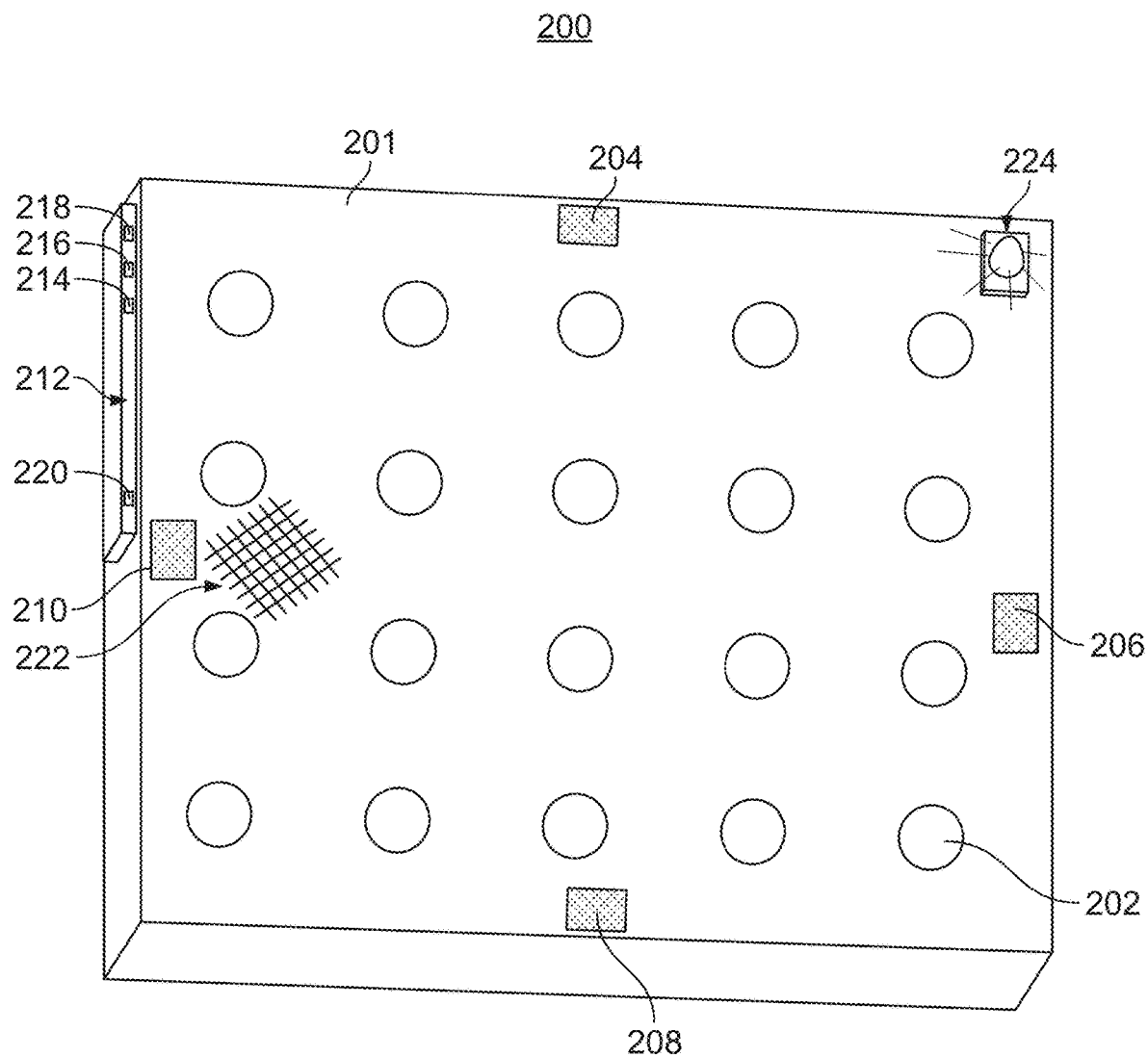
FIG. 2 shows a system diagram of an illustrative battery monitoring module, in accordance with some embodiments of the present disclosure.

FIG. 2 shows a system diagram of an illustrative battery monitoring module 200, in accordance with some embodiments of the present disclosure. In some embodiments, battery monitoring module 200 corresponds to battery module 102 of FIG. 1. Battery monitoring module 200 comprises battery enclosure 201. Battery enclosure 201 may fully encompass one or more battery cells such as, for example, battery cell 202. Battery cell 202 is found within battery enclosure 201. There may be multiple battery cells connected in series or parallel, or a combination of the two, via one or more busbars within battery enclosure 201. Light-detecting sensors 204, 206, 208, and 210 are positioned within battery enclosure 201. Light-detecting sensors 204, 206, 208, 210 may be positioned at any place within battery enclosure 201. It will be understood that while four light-detecting sensors are positioned within battery enclosure 201, any suitable number of light-detecting sensors can be used such as one, two, three, four, five, or more sensors.

In some embodiments, light-detecting sensor 204 may be placed in the middle of the top edge equidistance from the top corners of battery enclosure 201, light-detecting sensor 206 may be placed in the middle of the right edge equidistant from the right corners of battery enclosure 201, light-detecting sensor 208 may be placed in the middle of the bottom edge equidistant from the bottom corners of battery enclosure 201, and light-detecting sensor 110 may be placed in the middle of the left edge equidistant from the left corners of battery enclosure 201.

In some embodiments, light-detecting sensors 204, 206, 208, and 210 may be arranged nearer to positions where certain battery abnormalities are more likely to happen. The positions where certain battery abnormalities are more likely to happen may be determined based on testing data, and may also be user-defined.

In some embodiments, battery monitoring module 201 includes battery circuitry 212. Battery circuitry 212 may include power electronics, monitoring circuitry, switches, including switch 220 (e.g., a cutoff switch), and sensors, including temperature sensor 214, voltage sensor 216, and current sensor 218.

In some embodiments, the interior of the battery enclosure may be coated with reflective coating 222 (e.g., a coating with reflective or luminescent properties, or a combination of both properties). For example, reflective coating 222 may include properties that allows the coating to reflect light (e.g., a suitable reflectivity). In a further example, reflective coating 222 may include properties that allows the coating to luminesce light at a suitable wavelength based on absorbed light at one or more wavelengths. For example, there may be areas inside battery enclosure 201 where it is difficult or impossible to place a light-detecting sensor (e.g., light-detecting sensor 204), or areas out of range of a light-detecting sensor. These areas may be coated with reflective coating 222, which may reflect light back into the range of a light-detecting sensor (e.g., one or more of light-detecting sensors 204, 206, 208, and 210). Reflective coating 222 may be applied to battery enclosure 201 during the manufacturing process of battery enclosure 201, or may be applied after the manufacturing of battery enclosure 201, or a combination of both.

In some embodiments, the exterior of battery cells 112 may be coated with reflective coating 222. For example, reflective coating 222 may be applied to battery cells 112 to reflect light back into the range of a light-detecting sensor (e.g., one or more of light-detecting sensors 204, 206, 208, and 210). In some embodiments, instead of components (e.g., the battery enclosure, battery cells, etc.) being coated with reflective coating 222, the components may be made from materials that contain reflective properties (e.g., glass, polished metal, etc.).

In some embodiments, instead of components (e.g., the battery enclosure, battery cells, etc.) being coated with reflective coating 222, the components may be processed to increase reflectivity. For example, the interior of the battery enclosure may be polished to increase the reflectivity.

Battery monitoring module 200 also includes light emitter 224. Light emitter 224 may be any device that emits light. The functionality of light emitter 224 is discussed in more detail in FIG. 4. Light emitter 224 may be controlled via processing module 212. When battery monitoring module 200 corresponds to battery module 102 of FIG. 1, light emitter 224 may be controlled via processing module 104.

Figure 3:
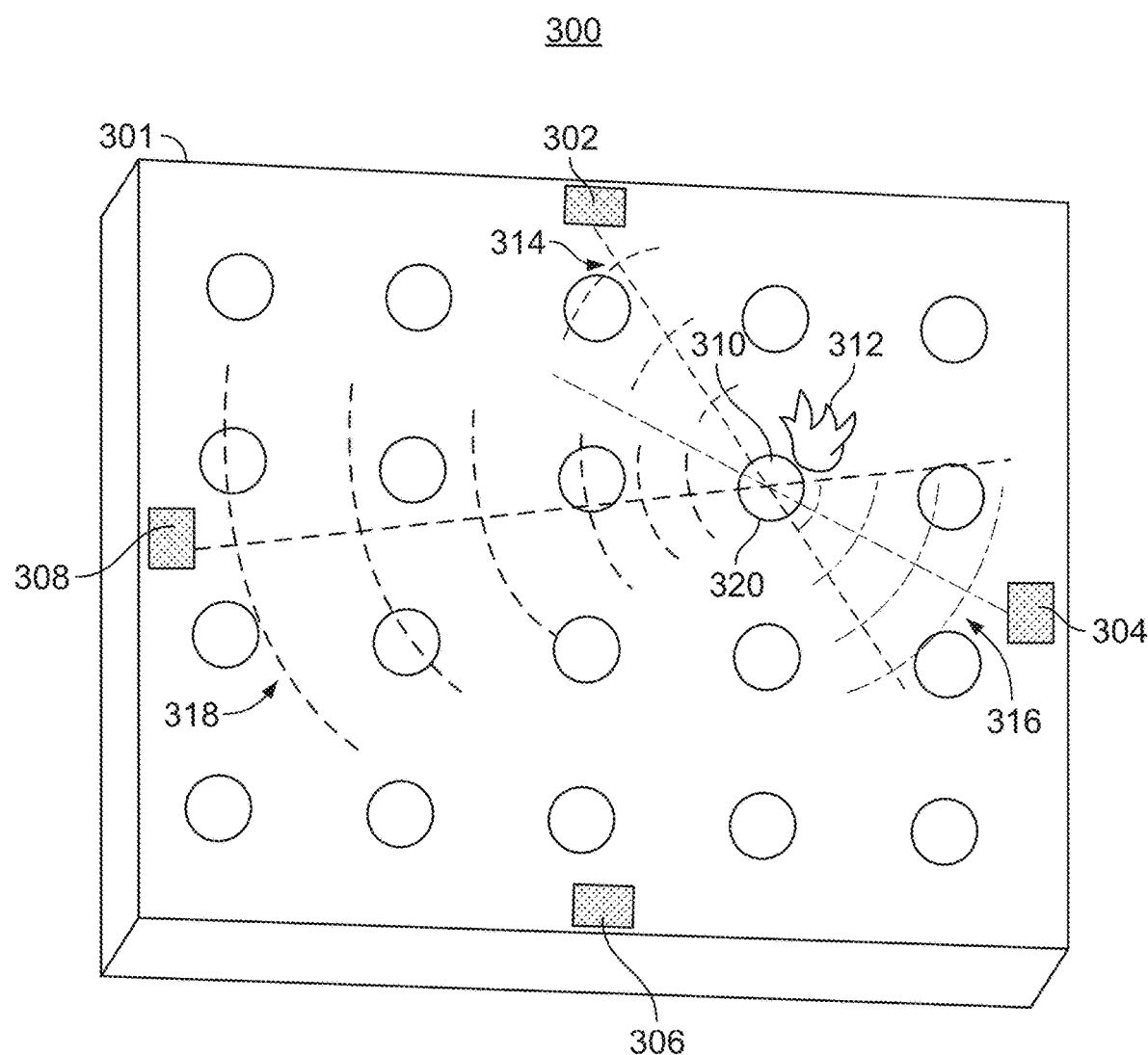
FIG. 3 shows a system diagram of an illustrative battery monitoring module detecting the location of a battery condition, in accordance with some embodiments of the present disclosure.

FIG. 3 shows a system diagram of an illustrative battery monitoring module 300 experiencing a battery condition, in accordance with some embodiments of the present disclosure. Light-detecting sensors 302, 304, 306, and 308 are placed within battery enclosure 301. For example, in some embodiments, light-detecting sensors 302, 304, 306, and 308 are placed on the perimeter of battery enclosure 301. Battery enclosure 301 may include a plurality of battery cells, including battery cell 310. In some embodiments, battery module 300 corresponds to battery module 200 of FIG. 2 experiencing a battery condition.

In some embodiments, battery condition 312 (e.g., an arcing condition, a fire, etc.) may occur proximate to battery cell 310. For example, in some embodiments, battery cell 310 may experience arcing, which may generate wavelengths in the ultraviolet (UV), visible light, and infrared (IR) wavelength range. Battery condition 312 may generate light (e.g., composed of one or more wavelengths), which may be represented by light propagation lines 314, 316, and 318. Light propagation lines 314, 316, and 318 indicate light propagating through the battery module towards the sensors (e.g., light-detecting sensors 302, 304, and 308). Once the light propagation reaches light-detecting sensor 302, light-detecting sensor 302 may send one or more signals containing information about received light to a processing module such as processing module 104. In some embodiments, the processing module may determine the location of battery condition 312 by determining the differences in time between when the light reaches light-detecting sensor 302, 304, and 308. In some embodiments, the time differences can be determined by identifying common fiducial points in the sensor signals determining the times corresponding to the fiducial points. Based on the time differences, the processing module may triangulate the location of battery condition 312, using normal triangulation means.

In some embodiments, processing module 104 may determine the location of battery condition 312 by comparing the amplitudes the light-detecting sensor signals. In some embodiments, the signal amplitudes indicate how much light is receive by each sensor. It is expected that a light-detecting sensor will receive more light the closer it is to a battery condition. Accordingly, based on the signal amplitudes, the processing module may triangulate the location of battery condition 312, using normal triangulation techniques.

Figure 4:
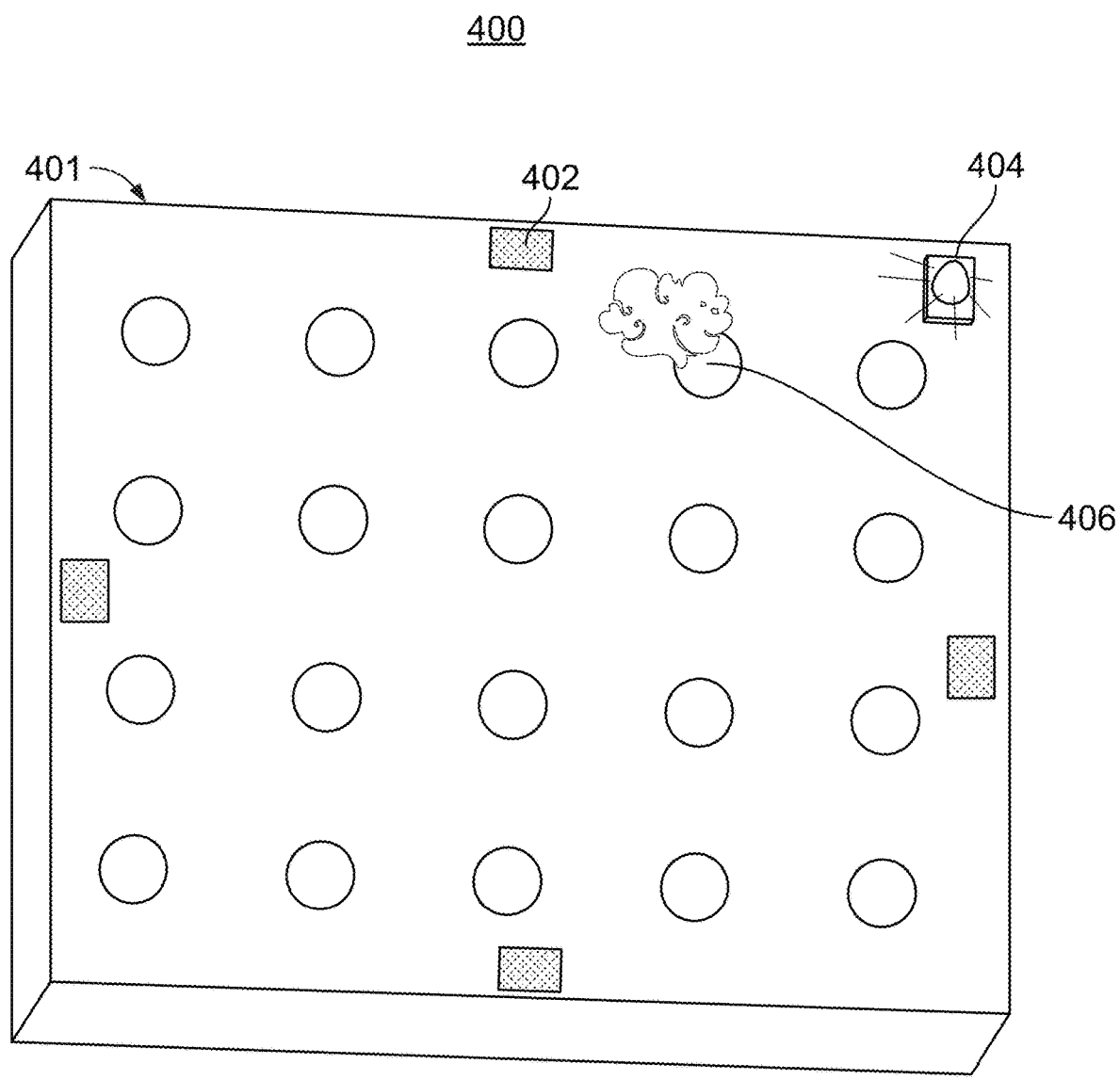
FIG. 4 shows a system diagram of an illustrative battery monitoring module that includes a light emitter, in accordance with some embodiments of the present disclosure.

FIG. 4 shows a system diagram of illustrative battery monitoring module 400 that includes light emitter 404, in accordance with some embodiments of the present disclosure. In some embodiments, battery monitoring module 200 corresponds to battery module 102 of FIG. 1 or battery monitoring module 200 of FIG. 2. Battery monitoring module 400 comprises battery enclosure 401 that may fully encompass one or more battery cells. Battery enclosure 401 also includes light-detecting sensor 402 and light emitter 404. Light-detecting sensor 402 and light emitter 404 may be mounted in any suitable location inside of battery enclosure 401. In some embodiments, two or more light-detecting sensors and two or more light emitters may be mounted inside of battery enclosure 401. Light emitter 404 may be any device that emits light, such as a light emitting device (LED), organic light emitting device (OLED), laser, incandescent light, filament, etc. Light emitter 404 may be controlled by a processing module such as processing module 104 of FIG. 1. The processing module may "turn on" (e.g., send a signal to light emitter 404 to generate light) light emitter 404 on a regularly scheduled interval, based on a user command, or any combination of the foregoing.

The light emitted by light emitter 404 can be used to determine whether a smoke condition exists inside of battery enclosure 401. The amount of light from light emitter 404 reaching light-detecting sensor 402 is expected to be affected by the presence of smoke. For example, the soot in smoke may absorb and also reflect light. Depending on where light-detecting sensor 402 and light emitter 404 are positioned and the content of the smoke, the amount of light received during a smoke condition may decrease or increase. Accordingly, when light emitter 404 is generating light, the signal from light-detecting sensor 402 can be recorded and analyzed to determine whether smoke is present inside of battery enclosure 401.

In some embodiments, a processing module (e.g., processing module 104 of FIG. 1) may use software (e.g., software 108 of FIG. 1) to compare the signal from light-detecting sensor 402 to a "control" signal stored in memory (e.g., storage 110 of FIG. 1). The "control" signal may be a sensor signal or a signal property (e.g., signal amplitude) taken during the manufacture and setup process of the battery enclosure. The processing module may compare one or more properties of the signals (e.g., the amplitude of each signal). The "control" signal may also be updated periodically as battery monitoring module 400 ages. For example, the "control" signal may be updated after a predetermined amount of time, predetermined amount of use, or a predetermined amount of charges. In some embodiments, the processing module may determine that smoke is present or a similar battery condition exists within the battery enclosure when the amount of light received (e.g., amplitude) is lower than the control signal by more than a threshold amount. The threshold amount may be a value determined by test data and stored in memory (e.g., storage 110 of FIG. 1). In some embodiments, the processing module may determine that smoke is present or a similar battery condition exists within the battery enclosure when the amount of light received (e.g., amplitude) is greater than the control signal by more than a threshold amount.

The processing module may also store the signal from the light-detecting sensor (e.g., in a database in storage 110) to allow a user or operator to track and condition inside of battery enclosure 401 over a period of time.

It will be understood that light-detecting sensor 402 may include any suitable imaging sensor disclosed herein. In some embodiments, light-detecting sensor 402 comprises an imaging sensor that takes an image inside of battery enclosure 401 when light emitter 404 is emitting light. In such embodiments, the brightness of the image, the color or colors of the image, or a combination thereof can be analyzed to determine whether a smoke or other condition is present. In some embodiments, the image can be analyzed by itself or in comparison to a "control" image to determine whether a smoke or other condition is present.

Figure 5:
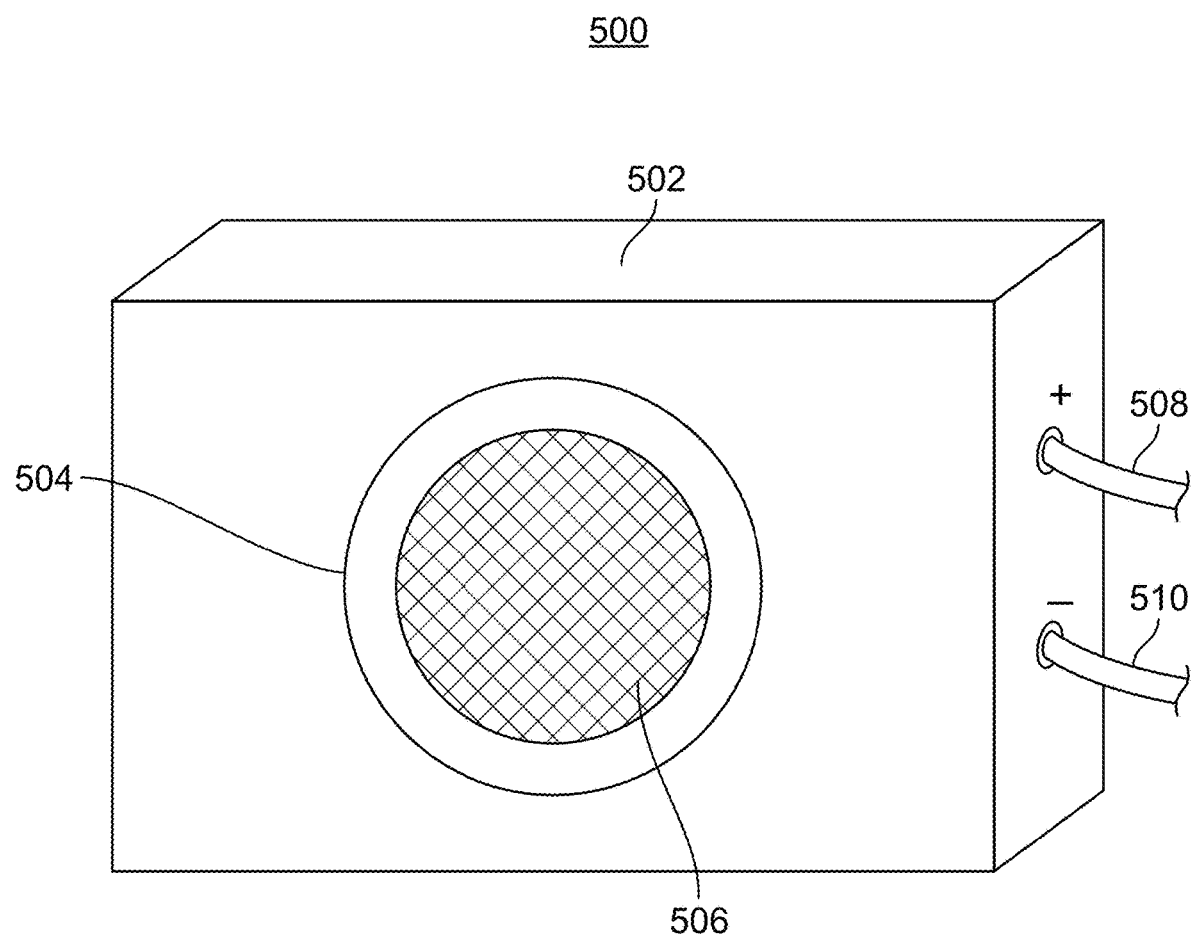
FIG. 5 shows a system diagram of a light sensor, in accordance with some embodiments of the present disclosure.

FIG. 5 shows a system diagram of light-detecting sensor 500, in accordance with some embodiments of the present disclosure. Light-detecting sensor 500 includes light-detecting sensor body 502. Light-detecting sensor body 502 may be made out of any functional material, such as plastic, metal, ceramic etc. Light-detecting sensor body 502 contains the circuitry needed for the light-detecting sensor to function and sense the presence of light. For example, light-detecting sensor 500 may become electrically conductive when exposed to light and may generate a current (e.g., a signal) corresponding to the detected light. Top surface 504 is comprised of a photoconductive material (e.g., germanium, gallium, selenium, silicon with added dopants, etc.). Top surface 504 becomes electrically conductive due to the absorption of electromagnetic radiation (e.g., such as visible light, UV light, IR light, etc.).

Filter 506 may be an optical filter that is separately coupled to light-detecting sensor 500, or built into light-detecting sensor 500 during manufacturing process. Optical filter 506 may be a device that selectively transmits light of different wavelengths. For example, optical filter 506 may be an absorption filter (e.g., a filter made of various compounds added to glass or plastic, where the compounds absorb some wavelengths of light while transmitting others), a dichroic filter (e.g., a filter made by coating glass substrate with a series of optical coatings to reflect unwanted wavelengths and transmitting the remainder).

In some embodiments, light-detecting sensor 500 may be powered and controlled via positive terminal 508 and negative terminal 510. For example, light-detecting sensor 500 may be coupled to a switch (e.g., such as switch 106 of FIG. 1), where the switch is then coupled to processing module 104 of FIG. 1. Processing module 104 may close the switch to turn "on" light-detecting sensor 500, and may "open" the switch to turn "off" light-detecting sensor 500. In some embodiments, light-detecting sensor 500 is passive and current is generated across terminals 508 and 510 when photons are absorbed.

In some embodiments, light detecting sensor 500 may include multiple sensor elements. For example, an array of sensor elements may be used, each with a different optical filter or no optical filter. The array of sensor elements may detect two or more of the following wavelengths of light: visible light, UV light, IR light, low frequency IR light, and any other suitable wavelengths of light.

In some embodiments, light-detecting sensor 500 may be used as any of the light-detecting sensors disclosed herein. For example, light-detecting sensor 500 may be used as light-detecting sensor 114 and light-detecting sensor 116 and may include light filter 118.

In some embodiments, light-detecting sensor 500 may be mounted directly to battery enclosure 201 of FIG. 2, or any surface within battery enclosure 201. In some embodiments, positive terminal 508 and negative terminal 510 may be coupled to processing module 104 of FIG. 1 via connectors (e.g., using through-hole or surface mount soldering techniques).

In some embodiments, light-detecting sensor 500 may be a photodetector, including photoemission devices (e.g., gaseous ionization detectors, photomultipliers, phototubes, microchannel plate detectors, etc.), semiconductor devices (e.g., active-pixel sensors, cadmium zinc telluride radiation detectors, charge-coupled devices, HgCdTe infrared detectors, reverse-biased Light Emitting Diodes (LEDs), photoresistors, photodiodes, phototransistors, quantum dot photoconductors, semiconductor detectors, silicon drift detectors, etc.), photovoltaic devices (e.g., photovoltaic cells), thermal devices (e.g., bolometers, cryogenic detectors, pyroelectric detectors, thermopiles, golay cells), photochemical devices (e.g., photoreceptor cells, chemical detectors), and polarization devices (e.g., polarization-sensitive photodetectors).

Figure 6:
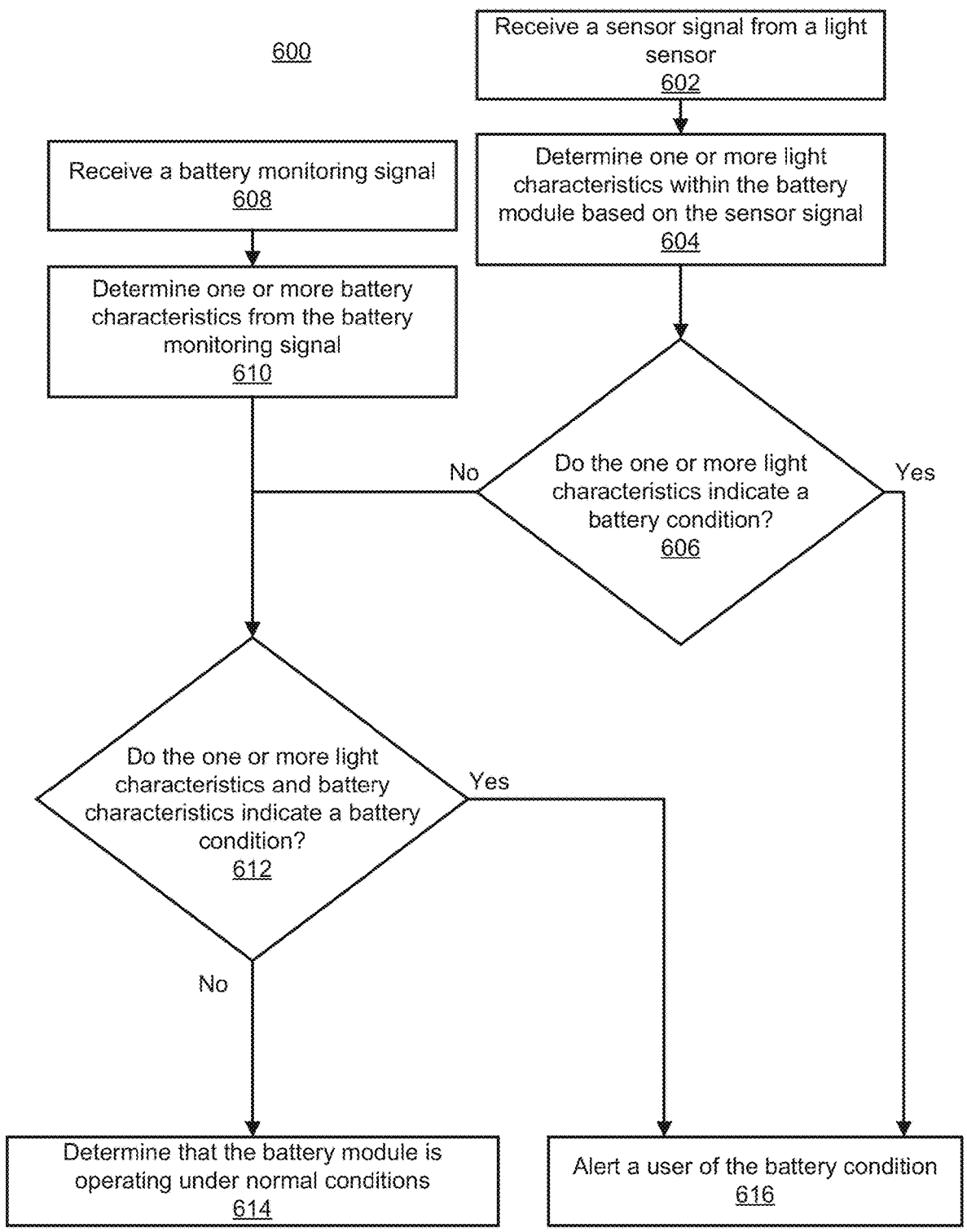
FIG. 6 is a flowchart of an illustrative process for monitoring a battery module, in accordance with some embodiments of the present disclosure.

FIG. 6 is a flowchart of an illustrative process 600 for monitoring a battery module, in accordance with some embodiments of the present disclosure. It should be noted that process 600 or any step thereof could be performed on, or provided by, any of the systems shown in FIGS. 1-5. In addition, one or more steps of process 600 may be incorporated into or combined with one or more steps of any other processes or embodiments described herein.

Process 600 begins at step 602, where a processing module (e.g., processing module 104 of FIG. 1) receives a sensor signal from a light sensor (e.g., light-detecting sensor 114). For example, at step 602, processing module 104 may record, using software 108, the input from light-detecting sensor 114. As another example, at step 602, processing module 104 may record the input from multiple light-detecting sensors (e.g., light-detecting sensors 114 and 116).

At 604, processing module 104 determines, using processing circuitry, a light characteristic within the battery module based on the sensor signal. For example, the processing module may analyze the light signal to determine one or more characteristics (e.g., wavelength, intensity, etc.).

At 606, processing module 104 determines whether the one or more light characteristics indicate a battery condition. Processing module 104 may compare the light characteristics to a database containing battery conditions associated with light characteristics (e.g., a look up table). In response to the comparison, processing module 104 may retrieve a battery condition (e.g., arcing) from the database.

In some embodiments, for example, at step 606, processing module 104 may determine, using software 108, that light is detected in battery module 102. If at step 606 processing module 104 determines that "Yes," the one or more light characteristics indicates a battery condition, then process 606 proceeds to 616.

In some embodiments, for example, at step 606, processing module 104 may determine, using software 108, that the determined light characteristic from the light signal from light-detecting sensor 114 indicates (e.g., based on the amplitude of the current signal) that white, blue, and ultraviolet light was detected. Software 108 may determine (e.g., via a lookup table) that there is sparking in battery module 102.

In some embodiments, for example, at step 606, processing module 104 may determine, using software 108, that there is no input from light-detecting sensor 114 or the input is below a threshold (e.g., a noise threshold), and therefore no light is detected in battery module 102. If, at 606, processing module 104 determines that "No," the one or more light characteristics do not indicate a battery condition, then process 606 proceeds to 612.

In some embodiments, if, at 606, processing module 104 determines that "No," the one or more light characteristics do not indicate a battery condition, process 606 may bypass step 612 and proceed directly to step 614. Step 612 is an optional step in process 600. For example, if, at 606, processing module 104 determines that "No," the one or more light characteristics do not indicate a battery condition, then step 606 may proceed directly to step 614, and processing module 104 may determine that the battery module is operating under normal conditions.

In some embodiments, processing module 104 may receive a signal from an auxiliary sensor (e.g., voltage sensor 124, current sensor 126, or temperature sensor 128 of FIG. 1) in addition to the signal from light-detecting sensor 114. In some embodiments, the processing module receives the battery monitoring signal from two or more auxiliary sensors. For example, the battery monitoring signal may be one or more of a voltage signal, current signal, and temperature signal. For example, at 608, processing module 104 receives a battery monitoring signal.

At 610, processing module 104 determines one or more battery characteristics from the battery monitoring signal. Processing module 104 may determine the battery characteristics from the battery monitoring signal using the techniques described above.

At 612, processing module 104 determines whether the one or more light characteristics and battery characteristics indicate a battery condition. Processing module 104 may determine whether the characteristics (e.g., the light characteristics and/or the battery characteristics) indicate a battery condition using the techniques described above. For example, the processing module may determine whether the characteristics of the light (e.g., in the UV wavelength range) and the battery monitoring signals (e.g., a signal from current sensor 126 indicating an abnormally high current) indicate a battery condition (e.g., arcing). Processing module 104 may compare the light characteristics and battery characteristics to a database containing battery conditions associated with specific light characteristics and battery characteristics (e.g., a look up table). In response to the comparison, processing module 104 may retrieve a battery condition (e.g., arcing) from the database.

For example, at step 612, processing module 104 may determine, using software 108, that the battery characteristic determined from the battery monitoring signal from current sensor 126 indicates that the current in battery cells 112 is higher than the upper bound of the normal current operating conditions, and may determine that the light characteristic determined from light-detecting sensor 114 indicates that a light wavelength in the ultraviolet range was detected.

As another example, at step 612, after processing module 104 determines, using software 108, that the battery characteristic determined from the battery monitoring signal from current sensor 126 indicates that the current in battery cells 112 is higher than the upper bound of the normal current operating conditions, and that the light characteristic determined from the signal from light-detecting sensor 114 indicates that light wavelengths in both the visible range and the ultraviolet range were detected, then processing module 104 may determine (e.g., via a lookup table of possible fault conditions using the inputs of high current and UV and IR light waves) that the fault condition is arcing.

As yet another example, at step 612, after processing module 104 determines, using software 108, that the battery characteristic determined from the battery monitoring signal from temperature sensor 128 indicates that the temperature in battery cells 112 is elevated and determines that the light characteristic determined from light-detecting sensor 114 indicates that a light wavelength in the visible range was detected, processing module 104 may determine (e.g., via a lookup table of possible fault conditions using the elevated temperature and visible light) that the fault condition is a fire and that the components in battery module 104 are heating up.

If, at 612, processing module 104 determines that "No," the one or more light characteristics and battery characteristics do not indicate a battery condition, then the process proceeds to step 614. If, at 612, processing module 104 determines that "Yes," the one or more light characteristics and battery characteristics indicate a battery condition, then the process proceeds to 616. At 614, processing module 104 determines that the batteries are operating under normal conditions. For example, in some embodiments, processing module 104 may determine that the characteristics do not indicate a battery condition and that the battery module is operating under normal conditions.

At 616, processing module 104 alerts the user of the battery condition. For example, in some embodiments, processing module 104 may alert the user by automatically shutting down the operation of the battery module (e.g., using active switch 106 as an emergency cutoff switch). In some embodiments, processing module 104 may alert the user by generating a pop-up message on a user device (e.g., a computer, mobile phone, smart phone, etc.) associated with battery monitoring module 100.

In some embodiments, for example, at step 616, processing module 104 may automatically power off the battery cells (e.g., using active switch 106 as a kill switch) in response to determining the occurrence of a possible battery fault. In some embodiments, processing module 104 may automatically power off the entire battery module 102 using active switch 106 in response to determining the occurrence of a possible battery fault. In some embodiments, software 108 may automatically power off one or more battery cells 112 in battery module 102 using active switch 106 in response to determining the occurrence of a possible battery fault.

Figure 7:
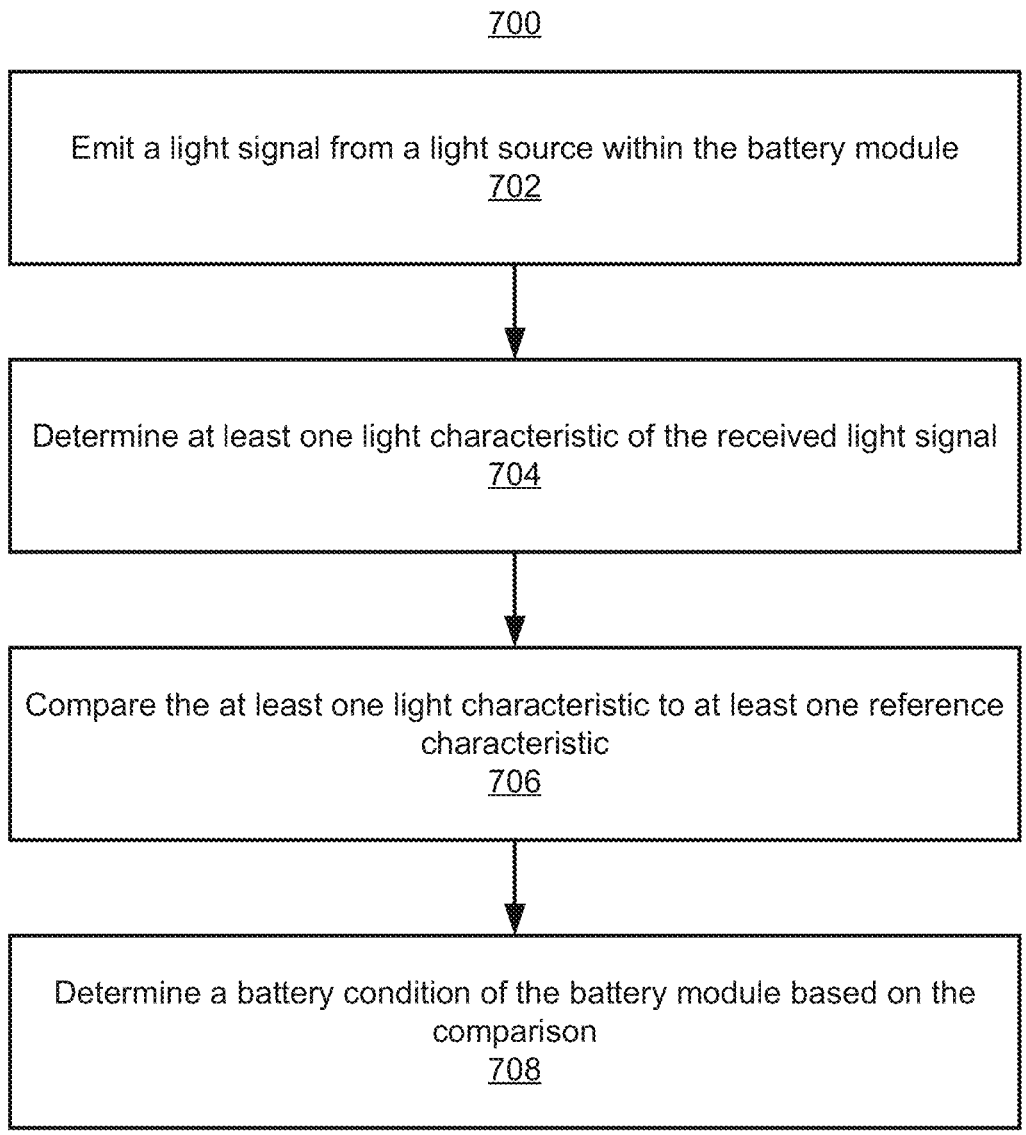
FIG. 7 is a flowchart of an illustrative process for monitoring a battery module using a light source, in accordance with some embodiments of the present disclosure.

FIG. 7 is a flowchart of an illustrative process for monitoring a battery module using a light source, in accordance with some embodiments of the present disclosure. It should be noted that process 700 or any step thereof could be performed on, or provided by, any of the systems shown in FIGS. 1-5. In addition, one or more steps of process 700 may be incorporated into or combined with one or more steps of any other processes or embodiments described herein.

Process 700 begins at 702, where processing module 104 causes a light source to emit light within a battery module (e.g., battery module 102). For example, processing module 104 may send a command to light emitter 120 to emit light. In some embodiments, processing module 104 may send a command to light emitter 120 to emit light at a specific wavelength, intensity, or combination thereof.

At 704, processing module 104 determines at least one light characteristic of a received light signal. Processing module 104 determines the at least one light characteristic of the received light signal using the methods described above. For example, processing module 102 may receive the light signal using light-detecting sensor 114. Processing module 104 may determine, using software 108, the light characteristic of the received light signal (e.g., using a look up table) by comparing the light signal to a datastore.

At 706, processing module 104 compares the at least one light characteristic to at least one reference characteristic. In some embodiments, processing module 104 retrieves the reference characteristic from a database in storage 110, or from a remote server via a network connection. For example, processing module 104 may retrieve a reference characteristic (e.g., intensity of light) from storage 110, where the reference characteristic is a control value determined by test data, or a control value input by a user, or a preprogrammed default control value, or a combination of the above.

In some embodiments, processing module 104 may use software 108 to compare the characteristic determined from a signal from light-detecting sensor 402 to a "control" characteristic stored in memory (e.g., storage 110 of FIG. 1). The "control" characteristic may be a signal property (e.g., signal amplitude) taken during the manufacture and setup process of the battery enclosure. The processing module may compare one or more properties of the signals (e.g., the amplitude of each signal). The "control" characteristic may also be updated periodically as battery monitoring module 104 ages. For example, the "control" characteristic may be updated after a predetermined amount of time, predetermined amount of use, or a predetermined amount of charges.

In some embodiments, for example, when the received light signal comprises an image of the inside of the battery enclosure, processing module 104 may compare the image to a control image (e.g., where the control image was taken at some point prior to the current image), and compare characteristics of the two images. In response to determining that the image has characteristics outside of a threshold range in comparison to the control image (e.g., the image is significantly darker than the control image), then processing module 104 may determine that particles caused by soot, smoke, or a potential solvent leakage are contained in battery module 102, and that a battery fault condition is occurring.

At 708, processing module 104 determines a battery condition of the battery module based on the comparison. For example, processing module 104 may determine a battery condition from the comparison (e.g., smoke from a fire) using the methods as described above.

In some embodiments, the processing module may determine that smoke is present or a similar battery condition exists within the battery enclosure when the characteristic determined from the amount of light received (e.g., amplitude) is lower than the control characteristic by more than a threshold amount. The threshold amount may be a value determined by test data and stored in memory (e.g., storage 110 of FIG. 1). In some embodiments, the processing module may determine that smoke is present or a similar battery condition exists within the battery enclosure when the characteristic determined from the amount of light received (e.g., amplitude) is greater than the control characteristic by more than a threshold amount.

Figure 8:
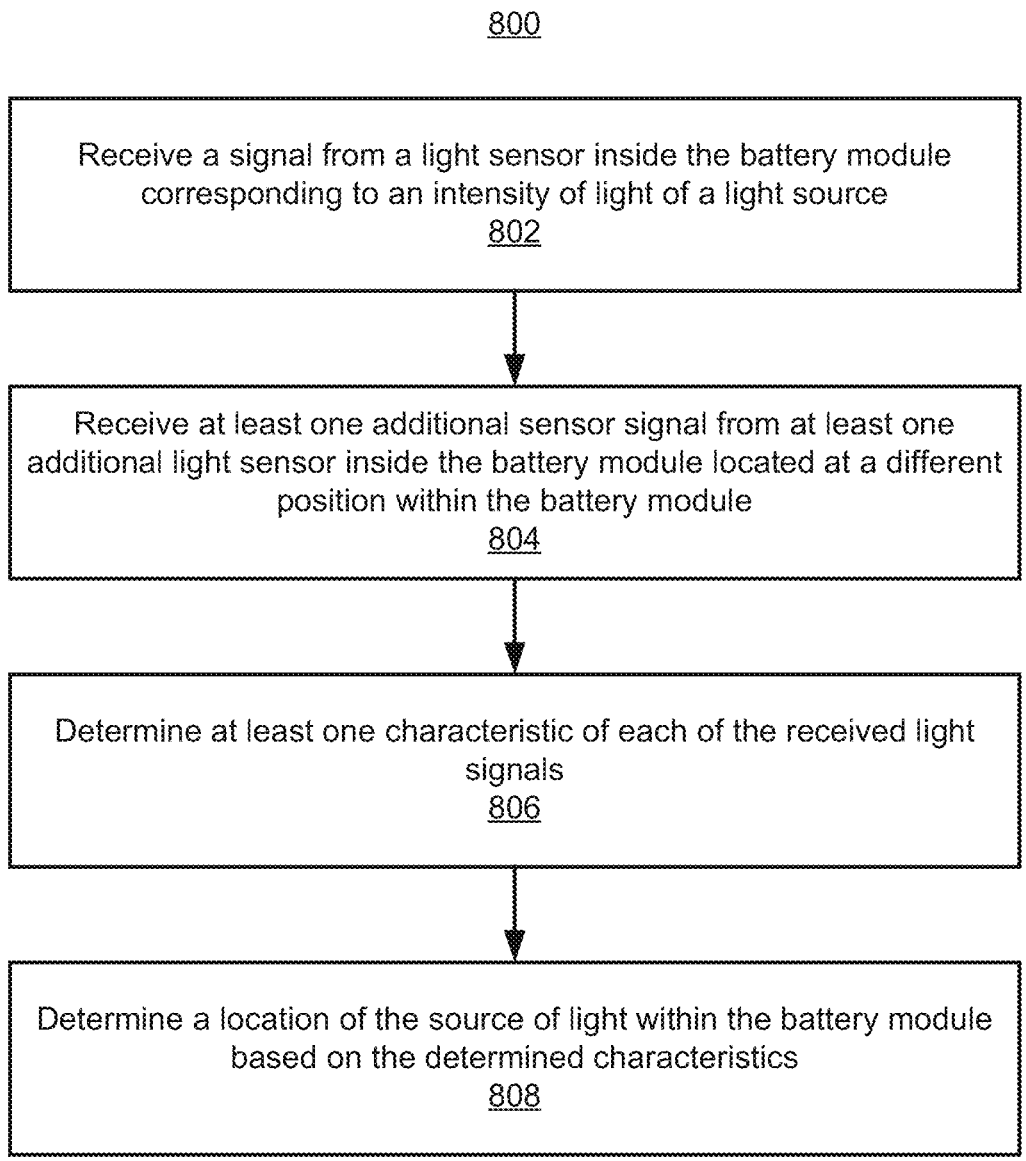
FIG. 8 is a flowchart of an illustrative process for detecting the location of a battery condition, in accordance with some embodiments of the present disclosure.

FIG. 8 is a flowchart of an illustrative process for detecting the location of a battery condition, in accordance with some embodiments of the present disclosure. It should be noted that process 800 or any step thereof could be performed on, or provided by, any of the systems shown in FIGS. 1-5. In addition, one or more steps of process 800 may be incorporated into or combined with one or more steps of any other processes or embodiments described herein.

Process 800 begins at 802, where processing module 104 receives a signal from a light sensor inside battery module 102 corresponding to an intensity of light of a light source. For example, at process 802, processing module 104 may receive a signal from light-detecting sensor 114 corresponding to detected light from a light source, where the amplitude of the signal represents the intensity of the light. At 804, processing module 104 receives at least one additional sensor signal from at least one additional light sensor inside battery module 102 located at a different position within battery module 102.

For example, at 804, processing module 104 may receive sensor signals corresponding to light propagations lines 314, 316, and 318, which indicate light propagating through the battery module towards the sensors (e.g., light-detecting sensors 302, 304, and 308). Once light propagation line 314 reaches light-detecting sensor 302, light-detecting sensor 302 may send a signal containing information about the received light to processing module 104.

At 806, processing module 104 determines at least one characteristic of each of the received signals. For example, processing module 104 may determine the intensity of light for each of the received signals using the amplitudes of the received signals. Processing module 104 may determine the intensity from the amplitude by retrieving the intensity from a datastore that links amplitudes to their corresponding intensities. As another example, processing module 104 may determine the arrival time of fiducial points in the received signals.

At 808, processing module 104 determines a location of the source of light within the battery module based on the determined characteristics of the received light signals. For example, processing module 104 may determine the location of the source of light within the battery module based on the intensities of light received at the sensors using known signal triangulation techniques.

In some embodiments, for example, at 808 processing module 104 may determine the location of battery condition 312 by comparing the amplitudes of the light-detecting sensor signals. In some embodiments, the signal amplitudes indicate how much light is receive by each sensor. It is expected that a light-detecting sensor will receive more light the closer it is to a battery condition. Accordingly, based on the signal amplitudes, the processing module may triangulate the location of battery condition 312, using normal triangulation techniques.

In some embodiments, for example, at 808 processing module 104 may determine the location of battery condition 312 by determining differences in time between when light reaches the different light-detecting sensors (e.g., light-detecting sensors 302, 304, and 308). In some embodiments, the time differences can be determined by identifying common fiducial points in the sensor signals (e.g., a peak or valley of a signal or a derivative of the signal) and determining the differences in arrival times corresponding to the fiducial points. Based on the time differences, the processing module may triangulate the location of battery condition 312, using normal triangulation means.

In some embodiments, for example, in response to determining the location of battery condition 312, processing module 104 may isolate battery condition 312 using active switch 106, or any other suitable control means. For example, processing module 104 may determine that battery condition 312 is confined to two battery cells (e.g., two cells in battery cells 112). The battery cells may be coupled to the busbar with one or more active switches. Processing module 104 may, by controlling the one or more active switch, uncouple the two batteries from the busbar to mitigate battery condition 312.

The above-described embodiments of the present disclosure are presented for purposes of illustration and not of limitation, and the present disclosure is limited only by the claims that follow. Additionally, it should be noted that any of the devices or equipment discussed in relation to FIGS. 1-5 could be used to perform one or more of the steps in processes 600-800 in FIGS. 6-8, respectively. Furthermore, it should be noted that the features and limitations described in any one embodiment may be applied to any other embodiment herein, and flowcharts or examples relating to one embodiment may be combined with any other embodiments in a suitable manner, done in different orders, performed with addition steps, performed with omitted steps, or done in parallel. For example, each of these steps may be performed in any order or in parallel or substantially simultaneously to reduce lag or increase the speed of the system or method. In addition, the systems and methods described herein may be performed in real time. It should also be noted that the systems and/or methods described above may be applied to, or used in accordance with, other systems and/or methods.

The foregoing is merely illustrative of the principles of this disclosure and various modifications may be made by those skilled in the art without departing from the scope of this disclosure.

The above described embodiments are presented for purposes of illustration and not of limitation.

The present disclosure also can take many forms other than those explicitly described herein.

Accordingly, it is emphasized that this disclosure is not limited to the explicitly disclosed methods, systems, and apparatuses, but is intended to include variations to and modifications thereof, which are within the spirit of the following claims.

What is claimed is:

1. A method for monitoring a battery module, which comprises at least two battery cells electrically coupled together within an enclosed structure, comprising:
    identifying a sensor signal from a light sensor arranged to detect light reflected from surfaces of the at least two battery cells; and
    determining a battery condition corresponding to a condition of an interior of the enclosed structure external to the surfaces of the at least two battery cells based on a light characteristic corresponding to the sensor signal.

2. The method of claim 1, further comprising:
    controlling emission of light from a light source arranged to emit light toward surfaces of the at least two battery cells, wherein the light source is controlled by processing circuitry.

3. The method of claim 1, further comprising:
emitting light from a light source within the battery module, wherein the light characteristic represents a light characteristic while light is being emitted from the light source; and
comparing the light characteristic to a reference characteristic, wherein:
determining the battery condition comprises determining a smoke or particulate condition within the enclosed structure and external to the surfaces of the at least two battery cells based on the comparison.

4. The method of claim 1, further comprising receiving a battery monitoring signal from a sensor configured to a detect a battery characteristic.

5. The method of claim 4, wherein the battery characteristic comprises at least one of battery temperature, battery current, or battery voltage.

6. The method of claim 4, wherein determining the battery condition of the enclosed structure comprises determining a battery fault when the light characteristic indicates an increase in light within the enclosed structure and when the battery monitoring signal indicates a relative increase in current.

7. The method of claim 6, wherein the battery fault comprises an arc condition.

8. The method of claim 4, wherein determining the battery condition of the enclosed structure comprises determining an enclosed structure breach when the light characteristic indicates light is present within the enclosed structure and when the battery monitoring signal indicates that the at least two battery cells are operating within normal parameters.

9. The method of claim 4, wherein determining the battery condition of the enclosed structure comprises determining a fire condition when the light characteristic indicates an increase in low frequency IR light and when the battery monitoring signal indicates an increase in temperature within the enclosed structure.

10. The method of claim 1, wherein one or more electrical components within the enclosed structure emit at least one wavelength of light during normal operation and wherein the light sensor comprises a light filter configured to attenuate the at least one wavelength of light.

11. The method of claim 1, further comprising:
identifying a temporal light intensity fluctuation in the sensor signal; and
differentiating light generated by one or more electrical components of the enclosed structure and light generated by an undesirable condition based on the identified temporal light intensity fluctuation.

12. The method of claim 1, wherein the light characteristic comprises a light characteristic for each of a plurality of wavelengths of light.

13. The method of claim 12, wherein the plurality of wavelengths of light comprises one or more of ultraviolet light, visible light, blue light, infrared light, or low frequency infrared light.

14. A system for monitoring a battery module, comprising:
the battery module, wherein the battery module comprises at least two battery cells electrically coupled together within an enclosed structure; and
processing circuitry configured to:
identify a sensor signal from a light sensor arranged to detect light reflected from surfaces of the at least two battery cells; and
determine a battery condition corresponding to a condition of an interior of the enclosed structure external to the surfaces of the at least two battery cells based on a light characteristic corresponding to the sensor signal.

15. The system of claim 14, wherein the processing circuitry is further configured to:
control emission of light from a light source mounted inside the enclosed structure, wherein the light source is arranged to emit light toward surfaces of the at least two of battery cells.

16. The system of claim 14, wherein the processing circuitry is further configured to:
emit light from a light source within the battery module, wherein the light characteristic represents a light characteristic while light is being emitted from the light source; and
compare the light characteristic to a reference characteristic, wherein:
determining the battery condition comprises determining a smoke or particulate condition within the enclosed structure and external to the surfaces of the at least two battery cells based on the comparison.

17. The system of claim 14, wherein the processing circuitry is further configured to identify a battery monitoring signal from a sensor configured to a detect a battery characteristic.

18. The system of claim 17, wherein the battery characteristic comprises at least one of battery temperature, battery current, and battery voltage.

19. The system of claim 14, wherein the light characteristic comprises an intensity of light corresponding to a light source, the processing circuitry further configured to:
identify at least one additional sensor signal from at least one additional light sensor configured to detect light within the enclosed structure, wherein the light sensor and the at least one additional light sensor are each located at a different position within the enclosed structure;
determine at least one additional intensity of light corresponding to the light source based on the at least one additional sensor signal; and
determine a location of the light source within the enclosed structure based on the intensity of light and the at least one additional intensity of light.

20. The system of claim 14, wherein the processing circuitry is further configured to:
identify a temporal light intensity fluctuation in the sensor signal; and
differentiate light generated by one or more electrical components of the enclosed structure and light generated by an undesirable condition based on the identified temporal light intensity fluctuation.

* * * * *